United States Patent
Forrester et al.

(10) Patent No.: US 9,432,756 B2
(45) Date of Patent: Aug. 30, 2016

(54) FEEDBACK ENCLOSURE AND FEEDBACK SYSTEM FOR A TRANSDUCER OF AN ELECTRONIC DEVICE

(71) Applicant: BlackBerry Limited, Waterloo (CA)

(72) Inventors: Chris Forrester, Kitchener (CA); Larry Edward Hawker, Waterloo (CA)

(73) Assignee: BLACKBERRY LIMITED, Waterloo (CA)

( * ) Notice: Subject to any disclaimer, the term of this patent is extended or adjusted under 35 U.S.C. 154(b) by 159 days.

(21) Appl. No.: 14/147,153

(22) Filed: Jan. 3, 2014

(65) Prior Publication Data

US 2015/0195631 A1    Jul. 9, 2015

(51) Int. Cl.
| | | |
|---|---|---|
| H04R 1/02 | (2006.01) | |
| H04R 1/20 | (2006.01) | |
| H04M 1/03 | (2006.01) | |
| H04R 3/00 | (2006.01) | |
| H03G 3/32 | (2006.01) | |
| H03G 5/00 | (2006.01) | |
| H03G 5/02 | (2006.01) | |
| H04M 1/60 | (2006.01) | |

(52) U.S. Cl.
CPC .............. *H04R 1/02* (2013.01); *H03G 3/32* (2013.01); *H04M 1/03* (2013.01); *H04R 3/002* (2013.01); *H03G 5/00* (2013.01); *H03G 5/025* (2013.01); *H04M 1/605* (2013.01); *H04R 2430/01* (2013.01); *H04R 2499/11* (2013.01)

(58) Field of Classification Search
CPC .......... H03G 5/00; H03G 5/025; H03G 3/32; H04R 1/02; H04R 3/002; H04R 2430/01; H04R 2499/11; H04M 1/605

USPC .......................................... 381/96, 108, 345
See application file for complete search history.

(56) References Cited

U.S. PATENT DOCUMENTS

| | | | |
|---|---|---|---|
| 5,461,676 | A  | 10/1995 | Hobelsberger |
| 6,130,945 | A  | 10/2000 | Shin |
| 6,661,901 | B1 | 12/2003 | Svean et al. |
| 7,003,123 | B2 | 2/2006  | Kanevsky et al. |
| 2002/0067838 | A1 | 6/2002 | Kindred et al. |
| 2002/0068537 | A1 | 6/2002 | Shim et al. |
| 2003/0108209 | A1 | 6/2003 | McIntosh |

(Continued)

FOREIGN PATENT DOCUMENTS

WO    WO 2008/061260 A2    5/2008
WO    WO 2009/155255 A1    12/2009

OTHER PUBLICATIONS

European Patent Application No. 14198840.2: Partial European search report dated May 11, 2015.

(Continued)

*Primary Examiner* — Duc Nguyen
*Assistant Examiner* — Sean H Nguyen
(74) *Attorney, Agent, or Firm* — Perry + Currier Inc.

(57) ABSTRACT

The disclosure recites a feedback system and method for adjusting output sounds generated by a communication device. The feedback system comprises: a transducer; a microphone; and an enclosure for the communication device defining a first location for the placement of the transducer, a second location for the placement of the microphone adjacent to the transducer, a first port connecting the first location to a cavity located on a top side of the enclosure, a second port connecting the second location to the cavity. For the system, the first port connects to the cavity beside the second port.

16 Claims, 11 Drawing Sheets

(56) References Cited

U.S. PATENT DOCUMENTS

| | | |
|---|---|---|
| 2004/0179701 A1 | 9/2004 | Boyd |
| 2005/0063556 A1* | 3/2005 | McEachen et al. .......... 381/104 |
| 2005/0226428 A1 | 10/2005 | McIntosh et al. |
| 2006/0109993 A1 | 5/2006 | Burger |
| 2006/0280316 A1 | 12/2006 | Prince |
| 2007/0274531 A1 | 11/2007 | Camp |
| 2008/0025525 A1 | 1/2008 | Tsai |
| 2008/0044040 A1* | 2/2008 | Werner et al. ................ 381/111 |
| 2008/0063219 A1 | 3/2008 | Park |
| 2008/0269926 A1 | 10/2008 | Xiang et al. |
| 2008/0298615 A1 | 12/2008 | Klinkby et al. |
| 2009/0315708 A1 | 12/2009 | Walley et al. |
| 2010/0027807 A1 | 2/2010 | Jeon |
| 2010/0080084 A1 | 4/2010 | Chen et al. |
| 2010/0158275 A1 | 6/2010 | Zhang et al. |
| 2011/0019848 A1 | 1/2011 | Fujii et al. |
| 2011/0064238 A1 | 3/2011 | Haas |
| 2011/0317069 A1 | 12/2011 | McRae et al. |
| 2012/0051555 A1 | 3/2012 | Schevciw et al. |
| 2012/0106759 A1 | 5/2012 | Chung |
| 2012/0207319 A1 | 8/2012 | Tsuchiya et al. |
| 2012/0250889 A1 | 10/2012 | Millett |
| 2012/0257761 A1 | 10/2012 | Kumar |
| 2013/0077804 A1 | 3/2013 | Glebe et al. |
| 2013/0084819 A1 | 4/2013 | Tohoku |

OTHER PUBLICATIONS

Extended European Search Report dated Sep. 16, 2015 for European Patent Application No. 14198840.2.
Extended European Search Report dated Jan. 28, 2016 for European Patent Application No. 14198840.2.

* cited by examiner

Fig. 4A
Fig. 4B
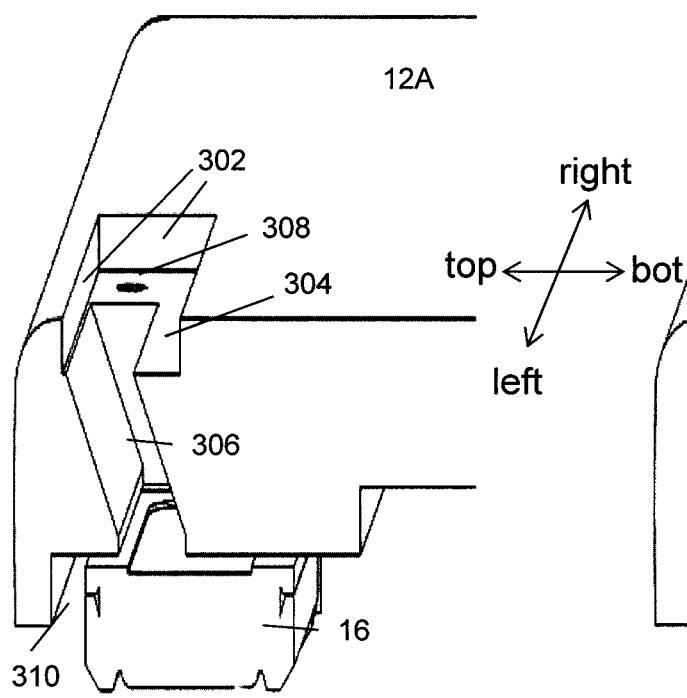
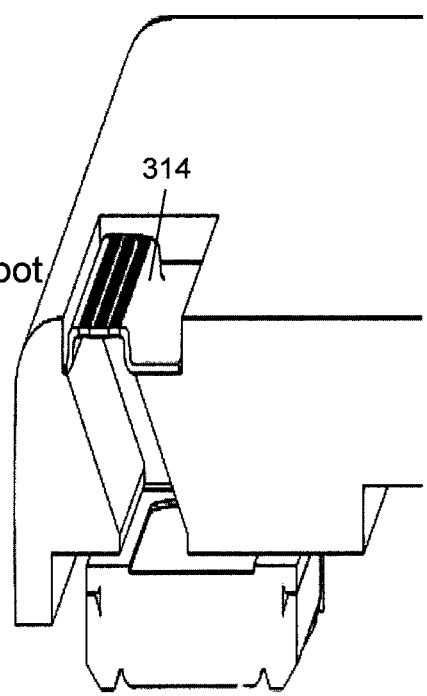

right ⟷ left

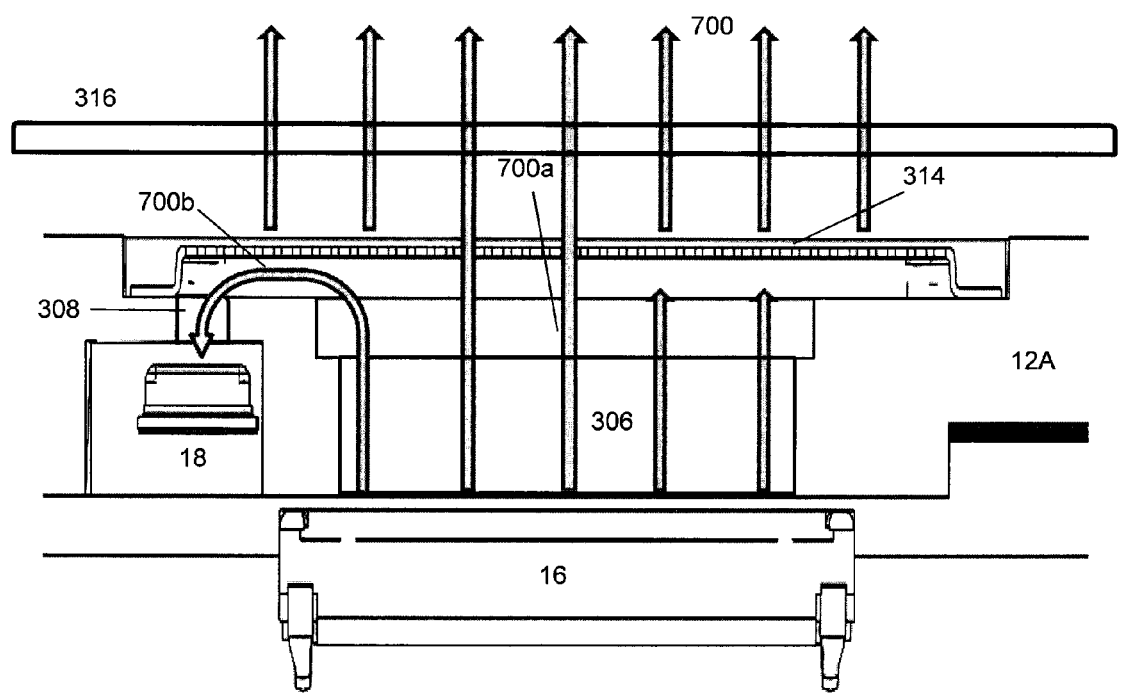

FEEDBACK ENCLOSURE AND FEEDBACK SYSTEM FOR A TRANSDUCER OF AN ELECTRONIC DEVICE

FIELD OF DISCLOSURE

The disclosure herein describes a feedback enclosure and a feedback system for a transducer of an electronic device. In particular, the disclosure relates to a feedback enclosure for a speaker (receiver) that provides feedback information that is used to modify acoustic and/or performance characteristics of the speaker.

BACKGROUND

As handheld communication devices are often used in non-ideal ambient acoustic environments, it is a challenge to provide maximum acoustic output under nominal or high leak conditions while not exceeding certain sound levels which may damage an ear of the user (over the short or long term exposure to such sound levels). A speaker is a transducer which is commonly provided with a device as an audio output device for such communication devices.

One currently-used technique to provide output sound levels that are in a safe range defines hard limits for sound levels generated by a speaker for a communication device set for worst case conditions when the speaker is exposed to the ear in a sealed environment, namely when the speaker is tightly acoustically sealed around the ear. This level of seal is a function of the pressure applied to the properly positioned device against the user's head. However, this leads to a compromise maximum level under normal or low seal conditions, which may lead to producing output sound signals that are at too low of a volume level, such that the user cannot hear the sound signals in high ambient noise environments.

There are standardized levels for acceptable measured acoustic shock levels for communication devices. For example, Underwriter Laboratory (UL) 60950 requirements for acoustics shock and safety in a mobile phone indicate that a mobile communication device must not generate a sound level in a headset receiver that exceeds 118 dBA (i.e. has a higher absolute value that exceeds 118 dBA) when the mobile phone is driven with a full scale square wave signal at a downlink input. Different thresholds are set for different receivers: 125 dBA for handsets, 118 dBA for headsets and 121 dBA for insert earphones.

To test output level of a speaker, the mobile communication device is placed on a Head and Torso Simulator (HATS) artificial ear with a force of 13 newtons (N), and the maximum sound pressure is measured. It will be appreciated that 13 N is a very strong force, emulating a situation where a user of a mobile device is pushing the mobile phone very firmly against his ear. This is referred to as a "low leak condition". However, under normal conditions, a user typically will not press the mobile phone against his ear with this level of force. In the 3GPP Technical Specification 26.131 standard, a normal user force for standard loudness measurement is set to be 8 N. As such, a force of 8 N is used to press against the ear for a HATS test to measure against maximum volume standards. This is commonly referred to as a Receiver Loudness Rating (RLR)=−13 dB.

As such, mobile phone designers typically design acoustic operating characteristics relating to gain and frequency response to tune responses of the acoustic system to achieve their desired results at the 8 N force.

Typically, the maximum sound pressure achieved for 13 N position is higher than the maximum sound pressure achieved for the 8 N position because the ear coupling is stronger as the applied force increases. As a result of this difference, at a pressure of 8 N, the maximum acoustic level achieved is typically lower than what is allowed by standards.

There is a need for acoustic systems to account for changes in maximum acoustic output levels at the receiver under non-ideal conditions, such as a low-leak condition.

BRIEF DESCRIPTION OF THE DRAWINGS

Details on the disclosure will now be described, by way of example only, with reference to the accompanying drawings, in which:

FIG. 4A is a side perspective view of a cross section portion of the housing showing the speaker and the enclosure system of FIG. 1;

FIG. 4B is a second side perspective view of the cross section portion of the housing showing the speaker and the enclosure system with a grill of FIG. 4A;

FIG. 7 is a top side cross section view of the housing showing paths of acoustic signal from the speaker through the enclosure system to the microphone of FIG. 1;

DETAILED DESCRIPTION OF AN EMBODIMENT

Figure 1:
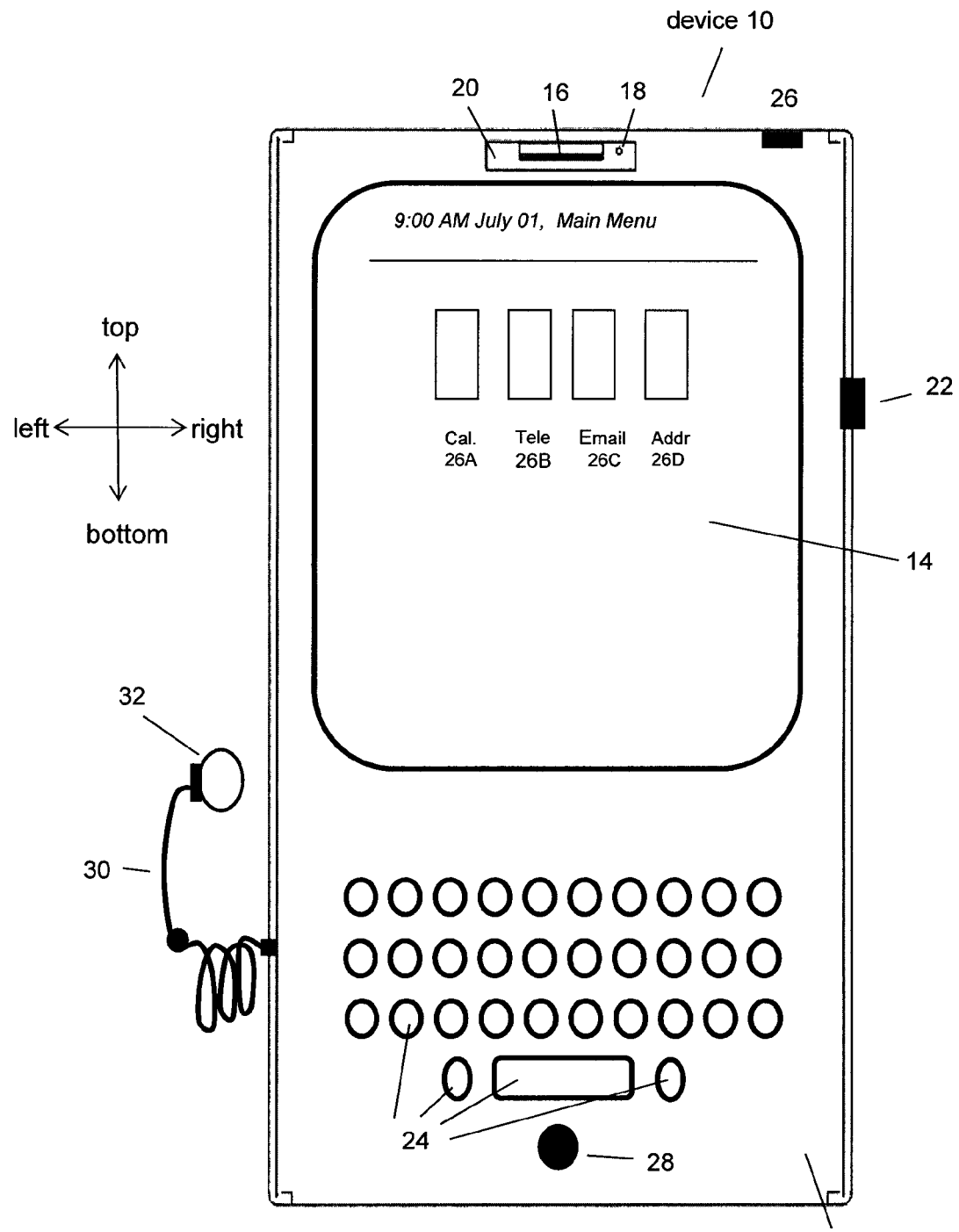
FIG. 1 is a front plan view of an electronic device with its housing having a speaker, a microphone and a feedback enclosure system and system for the speaker in accordance with an embodiment.

The description which follows and the embodiments described therein are provided by way of illustration of an example or examples of particular embodiments of the principles of the present disclosure. These examples are provided for the purposes of explanation and not limitation of those principles and of the disclosure. In the description which follows, like parts are marked throughout the specification and the drawings with the same respective reference numerals.

Briefly an embodiment provides a feedback system, method and device that dynamically adjusts the output level of a receiver (i.e. a speaker) in an electronic device to attempt to ensure that the output of the receiver does not exceed an output level (either immediately or for a duration of time) that is considered to be damaging to the user's ear. One embodiment employs a feedback signal system to monitor the output levels of the speaker that would be detected at the ear itself. As such, an embodiment uses signals from a detection device to adjust the desired output signal from the speaker. In comparison, noise cancelling headphones measure signals outside an ear cavity and generate an inverted signal compared to the detected (and unwanted) noise signal that is provided to speakers in the headphones.

The feedback signals may be provided by a microphone that is located near the receiver. An enclosure system for the speaker and the microphone is provided by an embodiment for a housing to provide such feedback signals. A speaker level application is provided using signals from the feedback system to evaluate the current sound output level of the speaker and to moderate same when an excess level in the output signal is detected. The excess level may be determined by a sound pressure level in any frequency band or in a specific frequency band. Moderating the output signal may be implemented in a reduction of the output level in all frequency bands (e.g. a constant voltage level reduction across frequencies) or in a reduction of the output level in a specific frequency band (e.g. in a lower frequency band). An embodiment may evaluate current operating conditions for the device and may adjust the output level accordingly to either increase or decrease the output signal. For example, if a "low leak" situation is detected or identified, the output level for the speaker may be initially decreased in view of same. Once decreased, the resulting detected sound level may be further adjusted (either subsequently decreased or increased) depending on current conditions of the output signal and/or the operating condition of the device. For one embodiment, a maximum pressure level of sound allowable to be produced by a speaker is kept to a pre-defined limit, to dispense with computations and adjustments of limits and corresponding signal levels when limits are changed. In another embodiment, limits may be dynamically set.

Features of an embodiment may be applied to headsets or any other device where a feedback device (such as a microphone) is placed in the ear cavity of a user or near the ear cavity so that a proportional measurement of the detected sound level can be transposed to a determined sound pressure level in the ear cavity of the user. An embodiment also reacts to the amount of time that the user is exposed to a level of sound (e.g. monitors the cumulative energy exposed to the ear cavity). Based on the cumulative level of sound determined, a further adjustment may be made to the output level. As such, an embodiment provides a sound energy detection system that provides a feedback system enabling calculation of an accurate level of sound exposed to the user's ear and based on the determined level an adjustment may be made to the output level.

In a first aspect, a feedback system for output sounds generated by a communication device is provided. The feedback system comprises: a transducer; a microphone; and an enclosure for the communication device defining a first location for the placement of the transducer, a second location for the placement of the microphone adjacent to the transducer, a first port connecting the first location to a cavity located on a top side of the enclosure, a second port connecting the second location to the cavity. For the system, the first port connects to the cavity beside the second port.

In the system, the first port may be shaped and has dimensions to be smaller than a cross section of an opening to an ear canal for a human.

In the system, the first port may have: a height of between approximately 1 mm and 4 mm; and a width of between approximately 2 mm and 15 mm.

The system may further comprise: a processor; a memory device; and an application stored in the memory device providing instructions for execution on the processor to measure the input signals detected by the microphone and when the input signals are determined to be less than when the input signals are determined to be less than a threshold for a receiver for one of a handset, a headset or insert earphone, not decrease an output level of a signal provided to the transducer. Different thresholds may be set for specific receivers, e.g. 125 dBA for handsets, 118 dBA for headsets and 121 dBA for insert earphones. The threshold value may be an approximate value.

In the system, the threshold may be for the headset. Further the threshold may be set to be approximately 118 dBA.

In the system, the application may provide further instructions for execution on the processor when the input signals are determined to be greater than the threshold, to decrease an output level of a signal provided to the transducer.

In the system, the application may provide further instructions for execution on the processor when the input signals are determined to be less than the threshold and greater than a minimum level, to either not change an output level of a signal provided to the transducer or change a characteristic of the output level to boost at least a portion of the signal provided to the transducer, where resulting input signals at the microphone are still below the threshold.

In the system, the application may provide further instructions for execution on the processor when the input signals are determined to be less than a minimum threshold, to increase an output level of a signal provided to the transducer, where the resulting input signals at the microphone are still below the threshold.

The system may further comprise an alignment feature protruding from either the housing or a cover for the housing, the alignment feature located near the cavity and providing a physically detectable feature indicating when the device is being positioned about a user's ear.

In a second aspect, a method of adjusting output sounds generated by a communication device is provided. The method comprises: measuring sound pressure levels detected by a microphone located in an enclosure for the communication device; and determining whether the sound pressure levels are less than a threshold for a receiver for one of a handset, a headset or insert earphone, and if so not decreasing an output level of a signal provided to the transducer. The enclosure defines: a first location for the placement of a transducer, a second location for the placement of the microphone adjacent to the transducer, a first port connecting the first location to a cavity located on a top side of the enclosure, and a second port connecting the second location to the cavity.

In the method, the threshold may be for the headset. Further the threshold may be set to be approximately 118 dBA.

The method may further comprise determining whether the input signals are greater than the threshold, and if so decreasing an output level of a signal provided to the transducer.

The method may further comprise determining whether the input signals are less than the threshold and greater than a minimum level, and if so, either not changing an output level of a signal provided to the transducer or changing a characteristic of the output level to boost at least a portion of the signal provided to the transducer, where resulting input signals at the microphone are still below the threshold.

The method may further comprise determining whether the input signals are less than a minimum threshold, and if so increasing an output level of a signal provided to the transducer, where the resulting input signals at the microphone are still below the threshold.

In the method, the first port may be shaped and has dimensions to be smaller than a cross section of an opening to an ear canal for a human.

In the method, the height of the first port may be between approximately 1 mm and 4 mm; and the width of the first port may be between approximately 2 mm and 15 mm.

In other aspects, various sets and subsets of the above noted aspects are provided.

First, general features of a device incorporating an embodiment are described. Second, features of an exemplary enclosure system for a feedback system of an embodiment are described. Third, exemplary processes that detect and adjust output sound level of a speaker of an electronic device according to an embodiment are described.

As such, referring to FIG. 1, general details of an electronic device for receiving electronic communications in accordance with an embodiment of the disclosure are now provided. In the present embodiment, electronic device 10 is a processor-controlled device (not shown) providing a computing platform having exemplary functionality of an enhanced "smart phone" providing voice, text, email and data communications, personal digital assistant functions and music, video and image capture, display, storage and sharing features. Software and firmware applications operating on device 10 control its operations and network connections to implement the above-noted features. User-installed applications ("apps") may also be selectively installed on device 10. Further detail on selected applications for an embodiment is provided later.

It is understood that electronic device 10 can be based on construction design and functionality of other electronic devices, such as personal digital assistants, handheld communication devices, desktop computers pagers or laptops having telephony equipment.

In a present embodiment, electronic device 10 includes a housing 12 comprising front housing 12A and rear housing 12B (not shown). There may be one or more components in device 10, including, for example any of: a display 14 (which may be a liquid crystal display or LCD), front speaker 16, feedback microphone 18, enclosure system in housing 12A providing part of a feedback system for signals from speaker 16 using microphone 18, activation button 22, keyboard 24, light emitting diode (LED) indicator 26 and microphone 28. Accessories, such as telephone headset 30 with earbud 32 may be connected to electronic device 10. Electronic device 10 may have additional input/output devices, such as a touchpad, trackball, trackwheel, additional function keys (not shown) which may provide input signals for programmable functions and/or for navigation signal to move through graphical user interfaces (GUIs) generated on display 14. Display 14 may include touch-screen features. A virtual keyboard may be provided through images of keys generated on display 14, thereby augmenting or replacing keyboard 24.

It will be appreciated that the terms "top" and "upper" may be used interchangeably the "front" side and the "top" end of device 10 and similarly that the terms "bottom", "rear" and "lower" may be used interchangeably with the "the back" side of device 10. The terms "left" and "right" are meant to describe locations in housing 12A when viewing housing 12A from its face with keyboard 24 as shown located at the bottom and display 14 located at the top. The relative positions and directions will be clear in the context of the use of the terms. These references provide relative positional references for components for convenience only and are not meant to be limiting, unless otherwise noted.

Housing 12 may be made from a plastic material, such as polycarbonate. Its components may be formed via an injection molding process. It may have coatings, such as metalicized paints or coatings provided to interior or exterior surfaces or regions. Housing 12 can be made from any suitable material (such as metal) as will occur to those of skill in the art and may be suitably formed to house and hold all components of device 10. A cover (not shown) may be provided for part of housing 12. A cover (not shown) or a bezel is a protective layer that may be provided to cover all or a part of the top surface of housing 12A and include a clear portion that covers display 14. The cover may also obscure the opening for speaker 16 and as such openings in the cover may be provided to allow sound to pass from speaker 16 through the cover to the ambient environment.

Device 10 is operable to conduct wireless telephone calls, using any wireless phone system. Exemplary technologies are any known wireless phone systems such as a Mobitex (trade-mark) network, a DataTAC (trade-mark) network, a General Packet Radio Service (GPRS) network and also a variety of data and voice communication networks, such as Advanced Mobile. Phone Service (AMPS), Time Division Multiple Access (TDMA), Code Division Multiple Access (CDMA) system, wireless CDMA, CDMA 2000 system, Cellular Digital Packet Data (CDPD) system, Personal Communication Service (PCS), Global System for Mobile Communication (GSM), Wi-Fi networks, 3GPP Long Term Evolution (LTE) networks, etc. Cellular networks for a given technology may operate in one or more bands and may have one or more channels for a particular band. For example, GSM networks may operate in one of three bands (900/1800/1900 MHz or 850/1800/1900 MHz) or in one of four bands (850/900/1800/1900 MHz). For a particular cellular network, device 10 may be operable to communicate in one or more bands. A band may be divided into a set of channels, where each channel occupies a particular subset of the spectrum of the band. For a LTE network, its standard supports packet switching in an IP network. Voice calls processed by device 10 in GSM, UMTS and CDMA 2000 may be circuit switched.

Other wireless communication systems that device 10 may support may include Wireless WAN (IMS), Wireless MAN (Wi-Max or IEEE 802.16), Wireless LAN (IEEE 802.11), Wireless PAN (IEEE 802.15, Zigbee™ and Bluetooth™), high-speed data packet access (HSDPA) networks, Evolved High Speed Packet Access (HSPA+) networks, etc. and any others that support voice and data. Additionally, a Bluetooth™ network may be supported. Other embodiments include Voice over IP (VoIP) type streaming data communications that may simulate circuit-switched phone calls. Device 10 may have capabilities of communicating with other devices using other communication technologies, including instant messaging (IM) systems text messaging (TM) systems and short message service (SMS) systems.

Device 10 may operate as a dual-mode modem. Its mobile data communication functions allow it to make WAN connections and allow it to deliver voice and e-mails to user of device 10.

Device 10 may have modules to provide near field communication (NFC), allowing it to communicate wirelessly with another device when the two devices are placed in very close proximity to each other. NFC technologies are an extension of the ISO 14443 proximity-card standard as a contactless card, Radio Frequency Identification (RFID) standard that incorporates the interface of a smartcard and a reader into one device. An NFC-enabled device typically includes an NFC integrated circuit (IC) that communicates to such devices as existing ISO 14443 smart cards and readers and other NFC devices and compatible with any existing contactless infrastructure. The NFC ICs may use magnetic field induction where two loop antennas are located near each other and form an air-core transformer. The NFC technology operates on an unlicensed radio frequency ISM band of about 13.56MHz and has a bandwidth of about 2 MHz. The working distance for the two devices is usually about between 0 and 20 centimetres. In use, a user of a first NFC device brings it close to another NFC enabled device or tag to initiate NFC communication. NFC data rates range from about 106 to 424 kbit/s.

Figure 2:
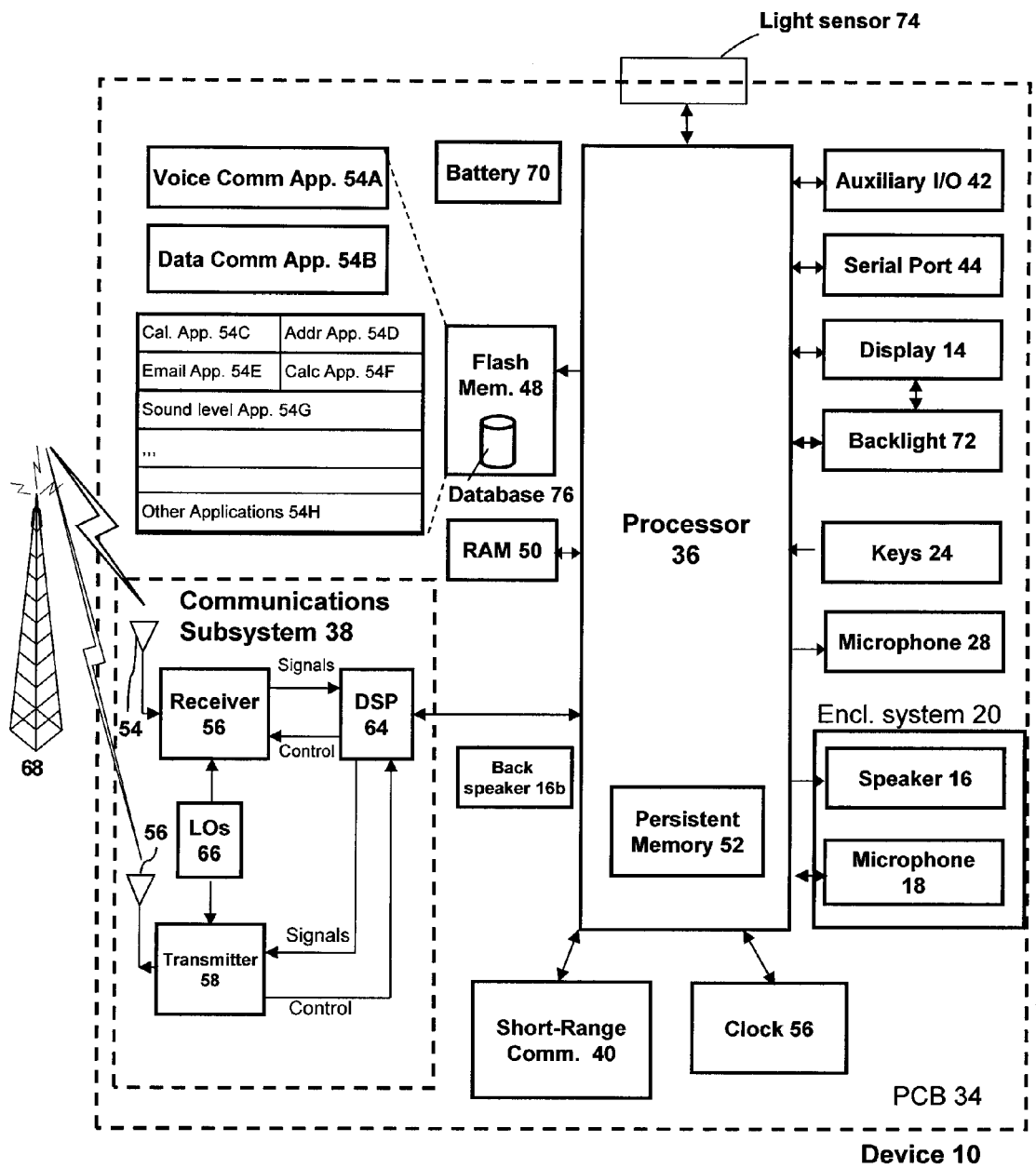
FIG. 2 is a block diagram of internal components of the device of FIG. 1 including the speaker, the enclosure system and a microphone providing feedback according to an embodiment.
Figure 3A:
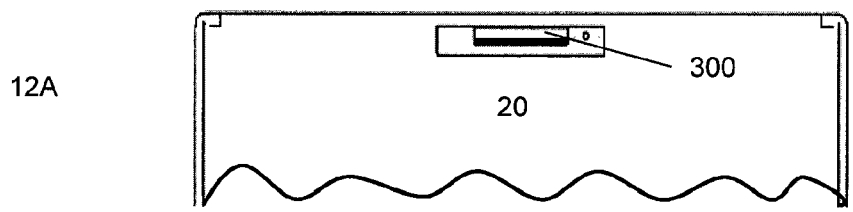
FIG. 3A is a front plan view of a portion of the housing showing the enclosure system of an embodiment for the electronic device of FIG. 1.
Figure 3B:
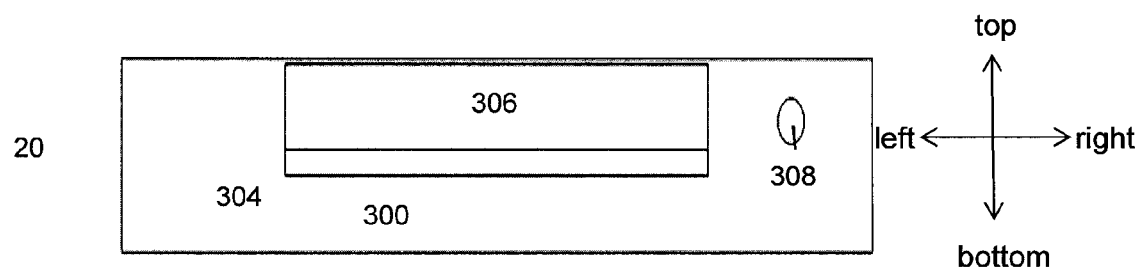
FIG. 3B is a front plan view of a portion of the housing showing the enclosure system of FIG. 3A.
Figure 3C:
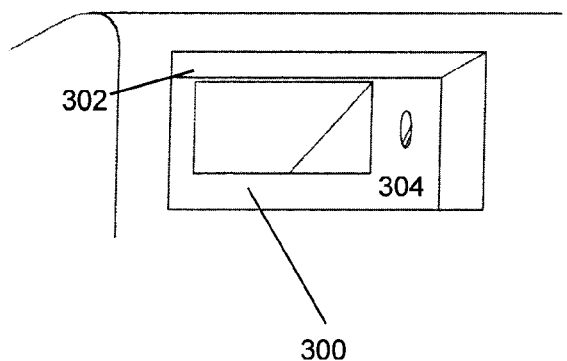
FIG. 3C is a front perspective view of a portion of the housing showing the enclosure system of FIG. 3A.
Figure 5:
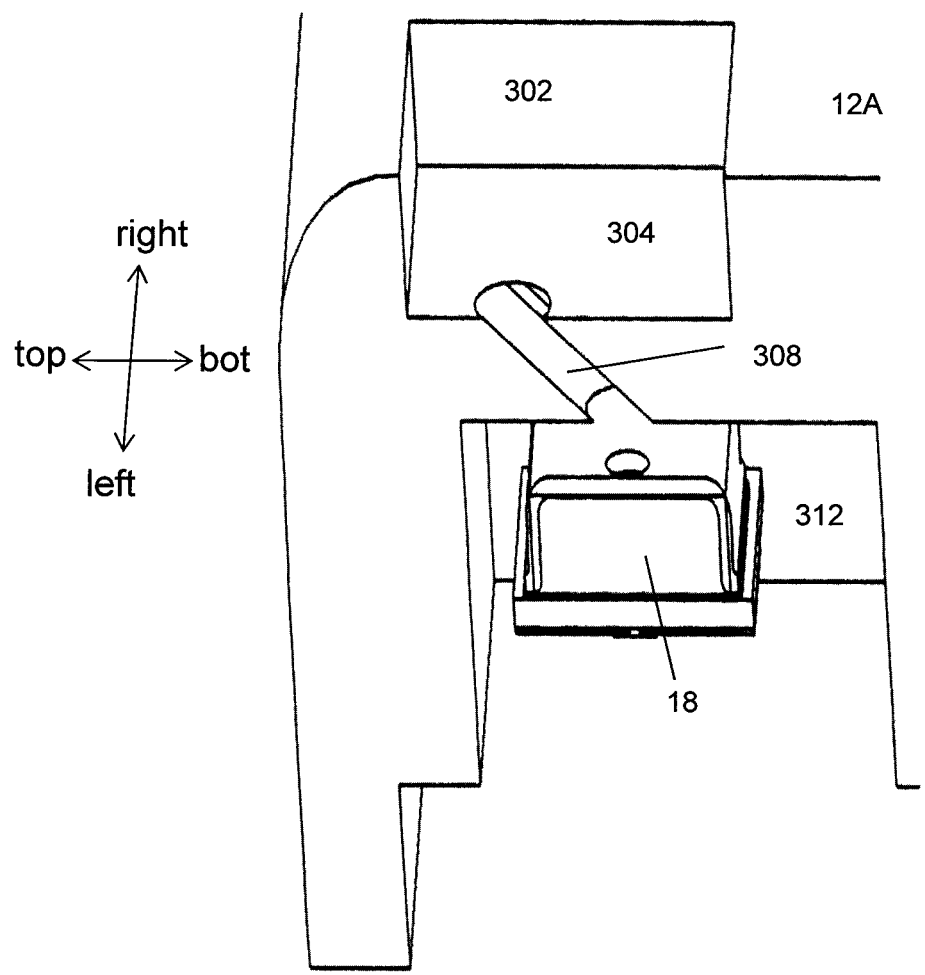
FIG. 5 is a side perspective view of a cross section portion of the housing showing the microphone and the enclosure system of FIG. 1.

Referring to FIG. 2, functional elements, modules, components and systems of device 10 are provided. The functional elements are generally electronic or electro-mechanical devices mounted within housing 12. Many devices are also mounted on an internal substrate, such as a printed circuit board (PCB). A substrate is any generally planar rigid platform. In one embodiment, PCB 34 is a substrate for mounting and supporting the internal components on both of its top and bottom sides and provides some electrical circuitry for the devices, as defined by etchings within the layers of plastic and copper. As such, components can be more densely packed thereon, thereby reducing the size of PCB 34. PCB 34 is securely mountable within housing 12, typically via screws. PCB 34 is a generally planar sandwich of layers of plastic (or FR4) and copper. PCB 34 allows components to be placed on both of its sides ("top" and "bottom"). Some components may require isolation or sufficient physical separation from other components. For example, radio frequency (RF) signals from antenna may interfere with the operation of other devices. Shielding may be provided. Further details on these components and layouts are provided below.

Processor 36 is provided to control and receive almost all data, transmissions, inputs and outputs related to device 10. Processor 36 is shown schematically as coupled to keys 24, touchpad, display 14 and other internal devices. Processor 36 controls the operation of display 14, as well as the overall operation of device 10, in response to actuation of keys 24 and keys on touchpad. Exemplary processors for processor 36 include microprocessors in the SnapDragon series (trademark) from Qualcomm and the PXA900 series available at one time from Intel Corporation.

In addition to processor 36, other internal devices of device 10 include: a communication subsystem 38; a short-range communication subsystem 40; touchpad; and display 14; other input/output devices including a set of auxiliary I/O devices through port 42, a serial port 44, a back speaker 16B, and microphone port 46 for microphone 28; and memory devices including a flash memory 48 (which provides persistent storage of data) and random access memory (RAM) 50; persistent memory 52; clock 56 and other device subsystems (not shown). There may be more than one front speaker 16 and/or back speaker 16B. Back speaker 16B may be provided on the back side of housing 12B, but may also be provided on other locations in device 10, such as on its side or even on its front in its housing 12. Persistent memory 52 may be a separate memory system to flash memory 48 and may be incorporated into a component in device 10, such as in processor 36. Additionally or alternatively, a memory module may be removable from device 10 (e.g. such as a SD memory card), whereas flash memory 48 may be permanently connected to device 10. Device 10 may be a two-way radio frequency (RF) communication device having voice and data communication capabilities. In addition, device 10 may have the capability to communicate with other computer systems via the Internet. One or both of speakers 16 and 16B may be selected and tuned to operate an acoustic frequency range suitable for telephone voice transmissions, where a focus is typically placed on response characteristics of signals between about 300 Hz and about 3,300Hz. Other ranges can be focused on depending on particular acoustic performance goals of the speaker(s).

Operating system software executed by processor 36 is preferably stored in a computer readable medium, such as flash memory 48, but may be stored in other types of memory devices (not shown), such as read only memory (ROM) or similar storage element. In addition, system software, specific device applications, or parts thereof, may be temporarily loaded into a volatile storage medium, such as RAM 50. Communication signals received by the mobile device may also be stored to RAM 50.

Processor 36, in addition to its operating system functions, enables execution of software applications on device 10. A set of software applications 54A-H that control basic device operations, such as voice communication application 54A and data communication application 54B, may be installed on device 10 during manufacture or downloaded thereafter.

Communication functions, including data and voice communications, are performed through communication subsystem 38 and short-range communication subsystem 40. Collectively, subsystems 38 and 40 provide signal-level interfaces for all communication technologies processed by device 10. Various other applications 54 provide the operational controls to further process and log the communications. Communication subsystem 38 includes receiver 56, transmitter 58 and one or more antennas, illustrated as receive antenna 60 and transmit antenna 62. In addition, communication subsystem 38 also includes processing module, such as digital signal processor (DSP) 64 and local oscillators (LOs) 66. Specific designs and implementations of communication subsystem 38 are dependent upon the communication network(s) in which device 10 is intended to operate. For example, communication subsystem 38 may be designed to work with one or more of a Mobitex (trademark) Radio Network ("Mobitex") and the DataTAC (trademark) Radio Network ("DataTAC"). Voice-centric technologies for cellular device 10 include Personal Communication Systems (PCS) networks like Global System for Mobile Communications (GSM) and Time Division Multiple Access (TDMA) systems. Certain networks provide multiple systems. For example, dual-mode wireless networks include Code Division Multiple Access (CDMA) networks, General Packet Radio Service (GPRS) networks, and so-called third-generation (3G) networks, such as Enhanced Data rates for Global Evolution (EDGE) and Universal Mobile Telecommunications Systems (UMTS). Other network communication technologies that may be employed include, for example, Ultra Mobile Broadband (UMB), Evolution-Data Optimized (EV-DO), and High Speed Packet Access (HSPA), etc.

In addition to processing communication signals, DSP 64 provides control of receiver 50 and transmitter 52. For example, gains applied to communication signals in receiver 56 and transmitter 58 may be adaptively controlled through automatic gain control algorithms implemented in DSP 64. DSP 64 and/or processor 36 may also process signals received from the feedback system for speaker 16 of an embodiment.

In a data communication mode a received signal, such as a text message or web page download, is processed by the communication subsystem 38 and is provided as an input to processor 36. The received signal is then further processed by processor 36 which can then generate an output to display 14 or to an auxiliary I/O port 42. A user may also compose data items, such as e-mail messages, using keys 24, another input device (not shown) and/or another auxiliary I/O device connected to port 42 or through a Bluetooth™ connection, such as a keypad. The composed data items may then be transmitted over communication network 68 via communication subsystem 38.

In a voice communication mode, overall operation of device 10 is substantially similar to the data communication mode, except that received signals are output to speaker 16, and signals for transmission are generated by microphone 28. Alternative voice or audio I/O subsystems, such as a voice message recording subsystem, may also be implemented on device 10.

Audio output from device 10 may be provided to one or more of speaker 16A, 16B and/or ear bud 30. Different acoustic signals may be provided to each speaker to tailor the output to each speaker.

Short-range communication subsystem 40 enables communication between device 10 and other proximate systems or devices, which need not necessarily be similar devices. For example, the short-range communication subsystem may include an infrared device and associated circuits and components, or a Bluetooth (trade-mark) communication module to provide for communication with similarly-enabled systems and devices.

Powering electronics of the mobile handheld communication device is power source 70 (shown in FIG. 2 as "battery"). The power source 70 includes one or more batteries. The power source 70 may be a single battery pack, especially a rechargeable battery pack. A power switch (not shown) provides an "on/off" switch for device 10. Upon activation of the power switch an application 54 is initiated to turn on device 10. Upon deactivation of the power switch, an application 54 is initiated to turn off device 10. Power to device 10 may also be controlled by other devices and by internal software applications. Additional supplementary power may be provided by additional circuits (which may be referred to as modules) and components in device 10.

Display 14 has backlight system 72 to assist in the viewing of display 14, especially under low-light conditions. A backlight system is typically present in a LCD. A typical backlight system comprises a lighting source, such as a series of LEDs or a lamp located behind the LCD panel of the display and a controller to control activation of the lighting source. The lamp may be fluorescent, incandescent, electroluminescent or any other suitable light source known to a person of skill in the art. As the lighting sources are illuminated, their light shines through the LCD panel providing backlight to the display. The intensity of the backlight level may be controlled by the controller by selectively activating a selected number of lighting sources (e.g. one, several or all LEDs) or by selectively controlling the activation duty cycle of the activated lighting sources (e.g. a duty cycle anywhere between 0% and 100% may be used).

To assist with one method of adjusting the backlight level, light sensor 74 is provided on device 10. Sensor 74 is a light sensitive device which converts detected light levels into an electrical signal, such as a voltage or a current. It may be located anywhere on device 10, having considerations for aesthetics and operation characteristics of sensor 74. In one embodiment, an opening for light to be received by sensor 74 is located on the front cover of the housing of device 10 to reduce the possibility of blockage of the opening. In other embodiments, multiple sensors 74 may be provided and the software may provide different emphasis on signals provided from different sensors 74. The signal(s) provided by sensor(s) 74 can be used by a circuit in device 10 to determine when device 10 is in a well-lit, dimly lit or moderately-lit environment. This information can then be used to control backlight levels for display 14.

Now, brief descriptions are provided on the applications 54 stored and executed in device 10. Voice communication application 54A and data communication application 54B have been mentioned previously. Voice communication application 54A handles voice-based communication such as telephone communication, and data communication application 54B handles data-based communication such as e-mail. In some embodiments, one or more communication processing functions may be shared between modules 54A and 54B. Additional applications include calendar 54C which tracks appointments and other status matters relating to the user and device 10. Calendar 54C is activated by activation of calendar icon in a GUI on display 14. It provides a daily/weekly/monthly electronic schedule of appointments, meetings and events entered by the user. Calendar 54C tracks time and day data for device 10 using processor 36 and internal clock 56. The schedule contains data relating to the current accessibility of the user. For example it can indicate when the user is busy, not busy, available or not available. In use, calendar 54C generates input screens on display 14 prompting the user to input scheduled events. Alternatively, notification for scheduled events could be received via an encoded signal in a received communication, such as an e-mail, SMS message or voice-mail message. Once the data relating to the event is entered, calendar 54C stores processed information relating to the event; generates data relating to the event; and stores the data in memory in device 10.

Address book 54D enables device 10 to store contact information for persons and organizations. Address book 54D is activated by activation of an address book icon generated in a GUI on display 14. Names, addresses, telephone numbers, e-mail addresses, cellphone numbers and other contact information are stored. The data can be entered through keys 24 and touchpad and is stored in an accessible database in non-volatile memory, such as persistent memory 52 or flash memory 48 or any electronic storage provided in device 10.

Email application 54E provides modules to allow user of device 10 to generate email messages on device 10 and send them to their addressees. Application 54E also provides a GUI which provides a historical list of emails received, drafted, saved and sent. Text for emails can be entered. Email application 54E is activated by activation of an email icon in a GUI generated on display 14.

Calculator application 54F provides modules to allow user of device 10 to create and process arithmetic calculations and display the results through a GUI.

Sound level application 54G tracks and analyzes current and previous sound output levels of speaker 16 and further analyzes signals received from microphone 18. Based on current and/or cumulative output levels that are provided to speaker 16 and further moderated by the analysis of signals received from microphone 18 and signals received from other sources, sound level application 54G may make an adjustment to characteristics of an output signal provided to speaker 16. The characteristics may change one or more of an output level or a frequency response level for certain frequencies. A feedback loop is provided to continually or periodically measure the signals received from microphone 18 (and/or from other sources) and to continually or periodically adjust characteristics of the output signal provided to speaker 16. DSP 64 (or another signal processing device in device 10) may be used to determine new input and/or output signal levels. Further detail on sound level application 54G is provided below.

Other application(s) 54H may be provided that perform other functions independently or for applications 54A-G.

Database 76 is provided to store data and records for applications 54 and other modules and processes. Database 76 may be provided in flash memory 48 or in another data storage element.

With general features of device 10 described above, now referring to FIGS. 1, 3A-3C, 4A-4B and 5-7, further details are provided on an exemplary enclosure system for a feedback system of an embodiment.

In one embodiment, main physical components of one feedback system include microphone 18 and enclosure system 20, which work with speaker 16 to channel some of the output signals from speaker 16 to microphone 18 so that microphone 18 can generate electrical signals that are proportional to an actual detected output signal from speaker 16 at a location that is near to the user's ear cavity (although while keeping microphone 18 preferably within device 10).

Figure 8A:
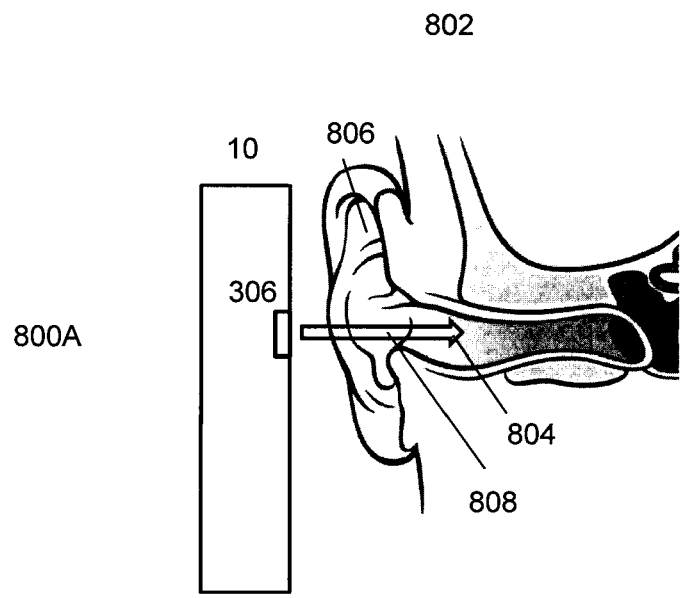
FIG. 8A is a schematic side view of a top portion of the electrical device of FIG. 1 being placed against an ear of a user of the electronic device, with the speaker of the electronic device being aligned with the ear canal of the ear according to an embodiment.
Figure 8B:
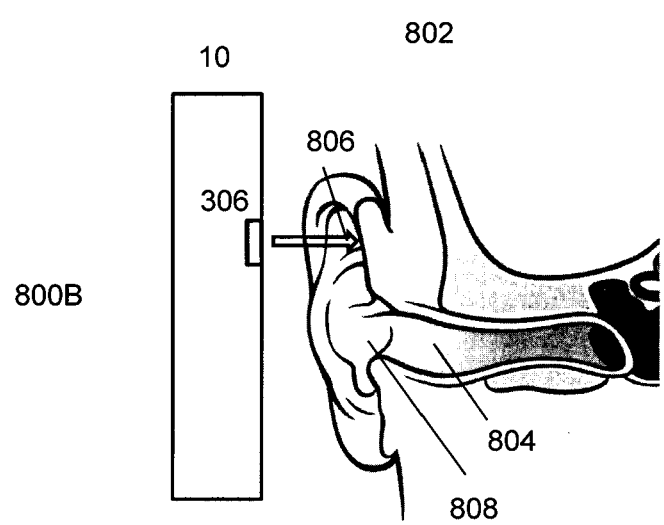
FIG. 8B is a schematic side view of a top portion of the electrical device of FIG. 1 being placed against an ear of a user of the electronic device, with the speaker of the electronic device not being aligned with the ear canal of the ear according to an embodiment.

In order to have the feedback system detect such "ear cavity" signals (or signals sufficiently close to being considered to be "ear cavity" signals with the user's ear forming an acoustic seal around speaker 16), microphone 18 is preferably located as close to speaker 16 as possible. In one embodiment, microphone 18 is located adjacent to speaker 16. FIGS. 8A and 8B described later, provide exemplary details of same.

FIGS. 3A-3C, 4A-4B and 5 show features of an embodiment in housing 12A of device 10, where speaker 16 and microphone 18 are located in enclosure system 20, at the top portion of device 10. Enclosure system 20 is a physical feature of housing 12A and provides an inward recess in the front face of housing 12A near its top and preferably in its left-to-right center. Enclosure system 20 includes a cavity 300 defined by inwardly extending walls 302 from the face of housing 12A and bottom 304, formed by housing 12A. The shape of cavity 300 in one embodiment is rectangular with its major access spanning from across the face of housing 12A. In one embodiment, the length of cavity 300 is approximately 3.4 mm (from top to bottom); the width of cavity 300 is approximately 23 mm (from left to right across device 10); and the depth of cavity 300 is approximately 0.9 mm (into device 10). In other embodiments, other shapes may be provided, which may be regular, irregular and/or a combination of shapes. As noted earlier a separate cover (not shown) may cover the face of housing 12A and thereby be placed over cavity 300. Openings through the cover may provide sound channels for sound produced by speaker 16 to emanate through the cover to the ambient environment.

Connected to cavity 300, speaker port 306 extends inwardly from bottom 304 through housing 12A and provides a connection to opening 310 in housing 12A where speaker 16 is located. As such, there is a direct acoustic channel formed from speaker 16 to cavity 300 through speaker port 306. Speaker port 306 is generally oblong in shape, extending across most of the length of cavity 300 and provides an offset air connection from the output point of speaker 16 to cavity 300. For one embodiment, the shape and dimensions of speaker port 306 are provided such that they do not exceed the size and/or shape of the size/shape of the cross section of a user's ear canal (shown in FIGS. 8A and 8B) for his ear and/or the user's concha for his ear. Exemplary dimensions are that port 306 has a height of between approximately 1 mm and 4 mm and a width of between approximately 2 mm and 15 mm. In one embodiment, port 306 extends obliquely into device 10 and has a net vertical depth of approximately 2.9 mm. In one embodiment, port 308 has a diameter of approximately 0.8 mm and has a length of approximately 0.65 mm and port 306 has cross-section dimensions of approximately 13 mm×2 mm and a length of approximately 2.95 mm. In one embodiment, port 308 extends obliquely into device 10 and has a net vertical depth of approximately 0.65 mm. The cross section area of grill 314 is approximately 23 mm (across) ×3.4 mm (high) ×0.9 mm deep). When the size and/or dimensions of speaker port 306 are configured to be no larger than a typical user's cross-section of his ear canal, it is possible to measure the sound pressure of the output of speaker 16 using a microphone (such as microphone 18) and this measured sound level provides a very good approximation for the sound pressure level that is imparted on the user's ear drum. In embodiments, the cross section dimensions may be set to be smaller than a typical user's ear canal (e.g. a typical adult male, a typical teenager, a typical child, etc.). In other embodiments, one or more of the cross section dimensions may be slightly larger (e.g. approximately 10-15%) than the identified typical user's ear canal.

For a given speaker, the volume of opening 310 and cavity 300 affects the performance characteristics of the speaker. In one embodiment, a volume of about 1 $cm^3$ is desired for cavity 300. However, a range of between about 0.3 $cm^3$ and 5.0 $cm^3$ or more may be provided in other embodiments. In other embodiments different dimensions for the length and width for opening 310 may be provided to tailor different effects on the frequency response for speaker 16. There may be a focus on such dimensions to provide different effects on changes to the higher frequency response resonances (e.g. above about 1 KHz in the nominal 300 Hz-3.4 KHz frequency response range for North American telephone signals).

Microphone port 308 extends inwardly from bottom 304 through housing 12A and provides an acoustic connection to second opening 312 in housing 12A to where microphone 18 is located. Microphone port 308 is in a spaced relationship to speaker port 306. As such, there is a direct, separate second acoustic channel formed from microphone 18 to cavity 300 through microphone port 308. Microphone port 308 is generally cylindrical in shape and provides an offset air connection from the input point of microphone 18 to cavity 300. In one embodiment, microphone port 308 is located to the right of speaker port 306 (when viewing housing 12A from at its face) and is located at approximately the same distance from the top of housing 12A as speaker port 306. In other embodiments, microphone port 308 may be located on the left, above or below speaker port 306 (when viewing housing 12A from at its face). It is notable that by locating microphone 18 and microphone port 308 near speaker 16, this proximity provides a reasonable assurance that the measured sound levels detected by microphone 18 are a reasonable facsimile to signals that would be measured at the ear cavity itself, when device 10 is located correctly against a user's ear with speaker 16 positioned against the ear with more than 8 N of force applied against device 10 towards the head of the user. Generally, microphone port 308 is relatively short in length and relatively large in cross-section dimensions, with a view to providing a reasonably flat frequency response with little or reduced high frequency resonance that might provide signals that cause microphone 18 to saturate/overload. The location of microphone 18 relative to speaker 16 is provided so that microphone 18 is sufficiently close to speaker 16 to receive output signals that are not attenuated, but not too close to speaker 16 to cause an audio feedback loop. In one embodiment, microphone 18 is laterally spaced from speaker 16 by approximately 2 mm (outer edge to outer edge). In other embodiment the lateral spacing may range between approximately 1 mm to 25 mm. The longer the spacing (e.g. towards approximately 25 mm), acoustic damping may need to be provided for a correspondingly long length of microphone port 308. In other embodiments, microphone 18 may be located at or near the surface of device 10 (e.g. located in cavity 300 itself without port 308 or with port 308 having a relatively short depth.).

Enclosure system 20 includes openings 310 and 312 in housing 12A that allow speaker 16 and microphone 18 to be located under cavity 300. Mounting hardware and acoustic gaskets that acoustically connect the opening of speaker 16 to port 306 and the opening of microphone 18 to port 308 are not shown. Grill 314 is provided as a cover that sits in cavity 300. It provides a physical barrier for dirt from entering from the environment to either speaker 16 or microphone 18.

Figure 6:
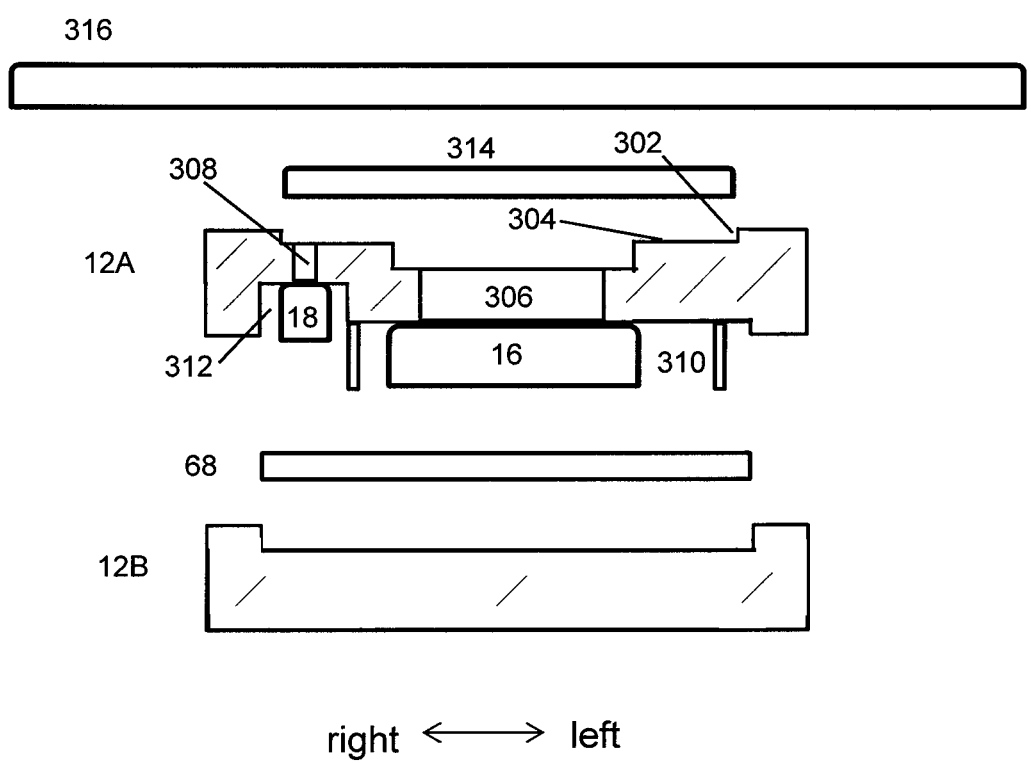
FIG. 6 is a top side cross section exploded view of the housing showing the speaker, the microphone and the enclosure system of FIG. 1.

FIGS. 6 and 7 show other views of housing 12A with cavity 300, speaker 16, microphone 18, speaker port 306, microphone port 308 and other components of an embodiment. FIG. 7 shows how output signals from speaker 16 (shown generally as arrows 700) emanate from speaker 16 in different paths. Arrows 700a show sound signals emanating directly upward from speaker 16 through port 306 and cavity 300 to the outside environment of device 10. Arrow 700b shows sound signals emanating upward from speaker 16 through port 306 and cavity 300 and down into port 308 to microphone 18. These signals received by microphone 18 are converted to electrical signals that an embodiment can use to determine a current output level of sounds assumed to be received by an ear of a user using device 10. Physical aspects of grill 314 may affect the quality of signals provided to microphone 18. For example, a grill that is more acoustically transparent will provide a more accurate sound level to microphone 18 corresponding to a sound level at the user's ear. Cover 316 is shown that covers housing 12A and cavity 300. Cover 316 has apertures therein to allow output of speaker 16 to be transmitted therethrough to the ambient environment of device 10.

FIGS. 8A and 8B show two exemplary orientations of device 10 about a user's ear and operation of aspects of an embodiment for the orientations.

In FIG. 8A, view 800A shows the top part of device 10 being placed against the head of user 802. Anatomical parts of the user's ear are shown, including ear canal 804, pinna 806 and concha 808. Concha 808 and canal 804 provide an acoustic conduit from the user's outside environment to the ear drum (not shown) of the ear. When port 306 is aligned over canal 804 and/or concha 808, it will be seen that the user's ear does not cover port 306 and as such, there is no loss (or an acceptable amount of loss) of sound energy from speaker 16 due to blockage of some part of port 306 by some part of the user's ear. In this orientation, if the detected sound pressure level measured by microphone 18 exceeds a pre-determined level, then an adjustment to the output level provided by speaker 16 is initiated.

In FIG. 8B, view 800B shows the top part of device 10 being placed against the head of user 802, where port 306 is aligned to pinna 806, which effectively covers at least a part of port 306 and as such, there is some loss of sound energy from speaker 16. In this orientation, the detected sound press level measured by microphone 18 is attenuated compared to the detected level in view 800A. As such, a boost adjustment to a component of the output level provided by speaker 16 may be initiated.

Figure 9A:
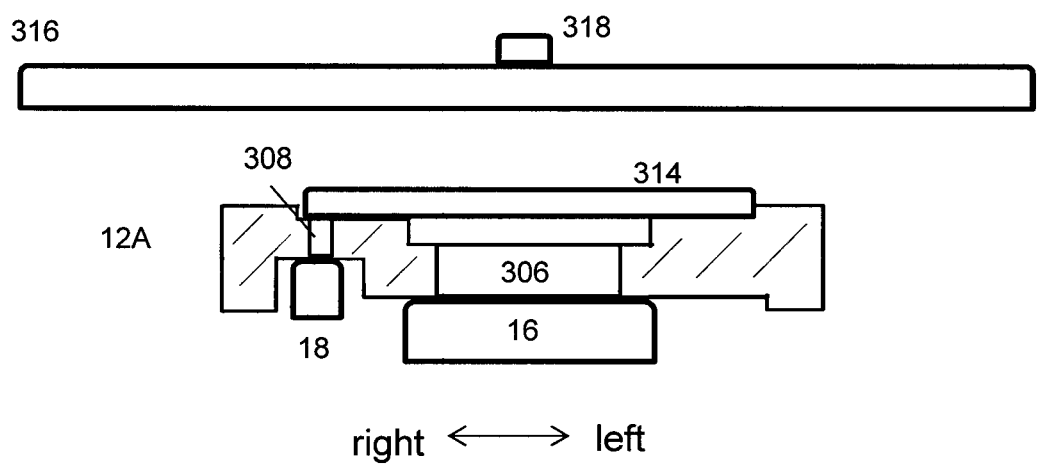
FIG. 9A is a top side cross section view of the housing showing the speaker, the microphone, the enclosure system of FIG. 1 with an alignment feature according to an embodiment.
Figure 9B:
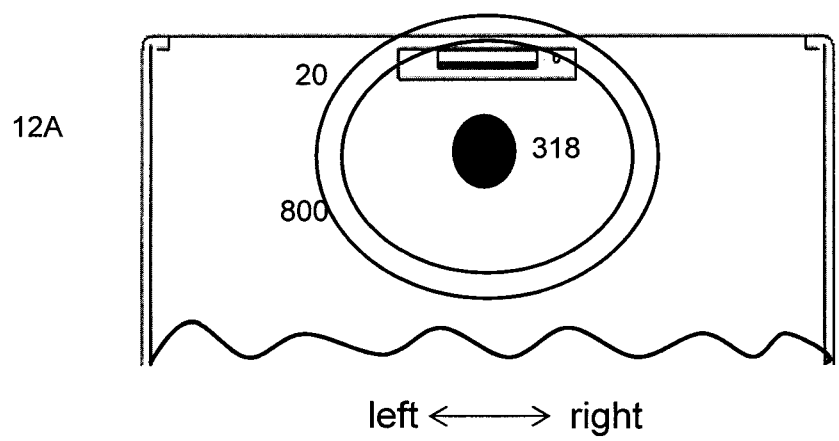
FIG. 9B is a front plan view of a portion of the housing showing the enclosure system with the alignment feature an embodiment for the electronic device of FIG. 9A.

FIGS. 9A and 9B show another embodiment, where alignment feature 318 is provided as a physical protrusion extending upwardly from the surface of device 10 near the location of speaker 16 (and enclosure system 20). In one embodiment, alignment feature 318 protrudes from either housing 12A or cover 316 on housing 12A covering cavity 300. In another embodiment, an alignment feature is provided on a cover for housing 12A. In any event, when components of device 10 are assembled, alignment feature 318 is located near cavity 300 and provides a physically detectable feature indicating when device 10 (and its speaker 16) is being positioned about a user's ear. The dimensions of the protrusion can vary in embodiments, but they should be large enough to be detectable by touch, but small enough to not be a visual distraction to the aesthetics of device 10. As an example, a range of dimensions for feature 318 may be that it has a length and width between about 1 mm and 10 mm and a height of between about 0.1 mm and 4 mm. When device 10 is properly placed against the user's ear with the ear covering the opening of enclosure system 20, alignment feature 318 is provided at a location that is also covered by the ear. As such, as the user moves device 10 up and down, left and right while trying to keep his ear as close to speaker 16 as possible, the user can feel alignment feature 318. When he determines that alignment feature 318 is located inside the perimeter of his ear (e.g., either by feeling that feature 318 is contacting an inner portion of his ear or by determining from an earlier sensation that feature 318 was located about his ear), he would know that speaker 16 is properly aligned to his ear. When he feels that alignment feature 318 is located on the edge of the perimeter of his ear or if he does not feel it at all, he would know that speaker 16 is likely not properly aligned to his ear and so he can move device 10 until he detects that alignment feature 318 is now located inside the perimeter of his ear. Silhouette 808 shows a notional outline of the border of the concha part of a user's ear covering enclosure system 20, speaker 16 and alignment feature 318, thereby providing a good acoustic seal for speaker 16. It will be appreciated that in other embodiments, a different shape for the feature, a different number of features, a depression, a texture feature and/or other physical features may be provided for feature 318. It will be appreciated that feature 318 may or may not be provided in different embodiments.

With features enclosure systems of device 10 described above, now details on exemplary processes that detect and adjust output sound level to a speaker of an electronic device according to an embodiment are provided.

Figure 10:
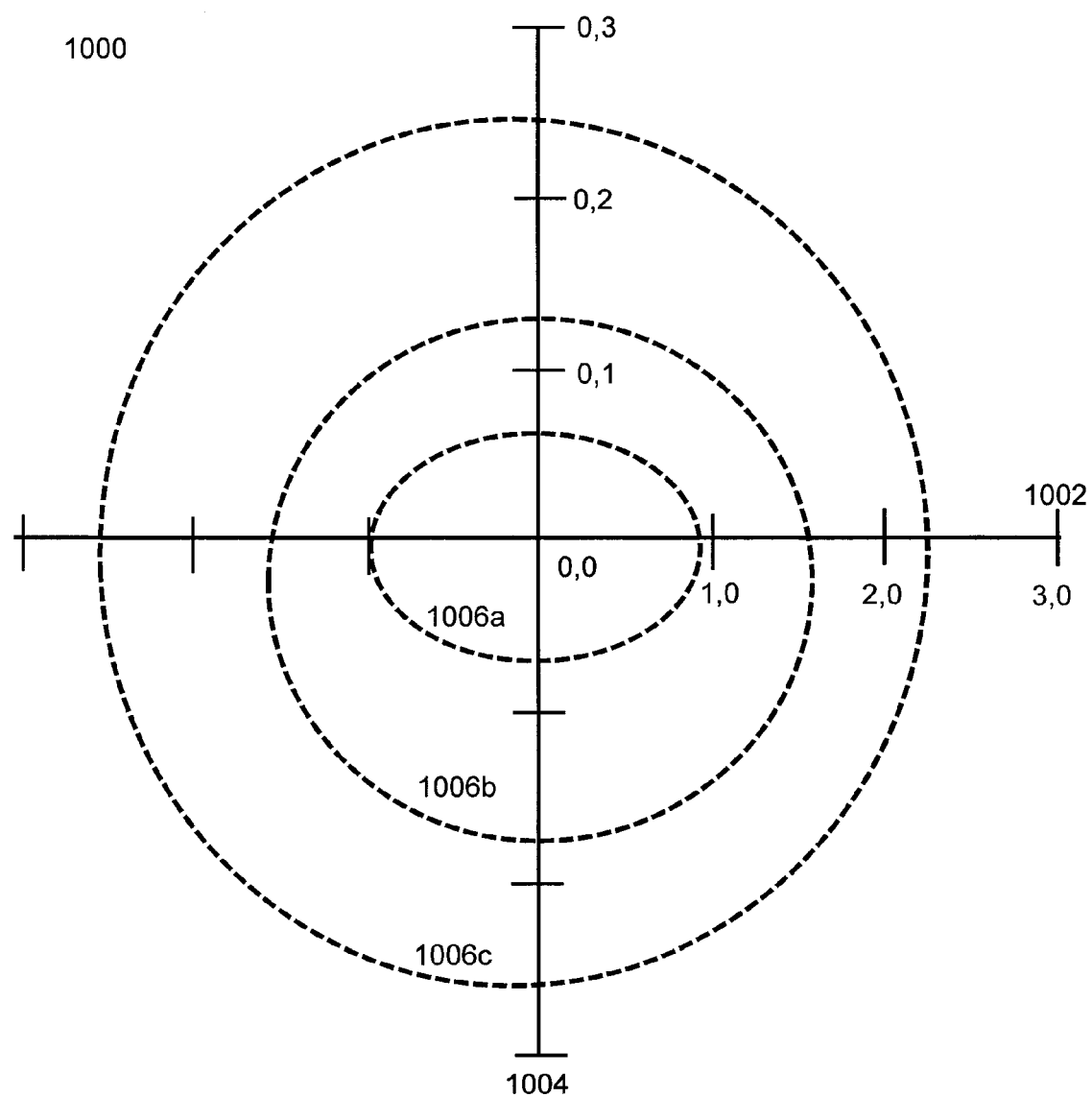
FIG. 10 is a schematic diagram mapping various detected sound level characteristics for an output of a speaker for the electronic device of FIG. 9A, when the user's ear is at different locations relative to the speaker.

Referring to FIG. 10, graph 1000 shows exemplary different sound pressure levels that may be present at a user's ear for different positioning situations for device 10 and speaker 16 against a user's ear. Graph 1000 has x-axis 1002 and y axis 1004, where the origin (0, 0) represents the spot where speaker 16 is directly opposite the user's ear. The numbers on the axes are provided to mark positions and are unitless. When speaker 16 is properly aligned to the user's ear, the ear receives a signal from speaker 16 that has a minimal amount of sound level loss. When there is a minimal amount of sound level loss, the output parameters of speaker 16 can be adjusted to assume that there is only a minimal amount of sound level loss. This "prime area" is noted by region 1006a, where received signals from microphone 18 have values that exceed a first threshold. Conversely, if it is determined that speaker 16 is not properly aligned to the user's ear, it can be assumed that there is some level of sound level loss. Accordingly, the output parameters of speaker 16 can be adjusted to boost some characteristics of the output signal to adjust for this presumed level of sound loss. It will be appreciated that these signals would have values that are below the first threshold. Two subordinate areas are noted by regions 1006b and 1006c. In region 1006b, received signals from microphone 18 have values that are less than the first threshold, but exceed a second threshold. Additional subordinate areas may be provided. In region 1006c, received signals from microphone 18 have values that are less than the second threshold, but exceed a third threshold. It can be seen that the position of speaker 16 relative to the ear for each region is not necessarily symmetric about the x and y axes. Depending on the signal level detected, an embodiment may determine that device 10 is properly located about the user's ear, or located at secondary or other locations and depending on the determined location, further adjustments to the output signal may be provided.

Figure 11:
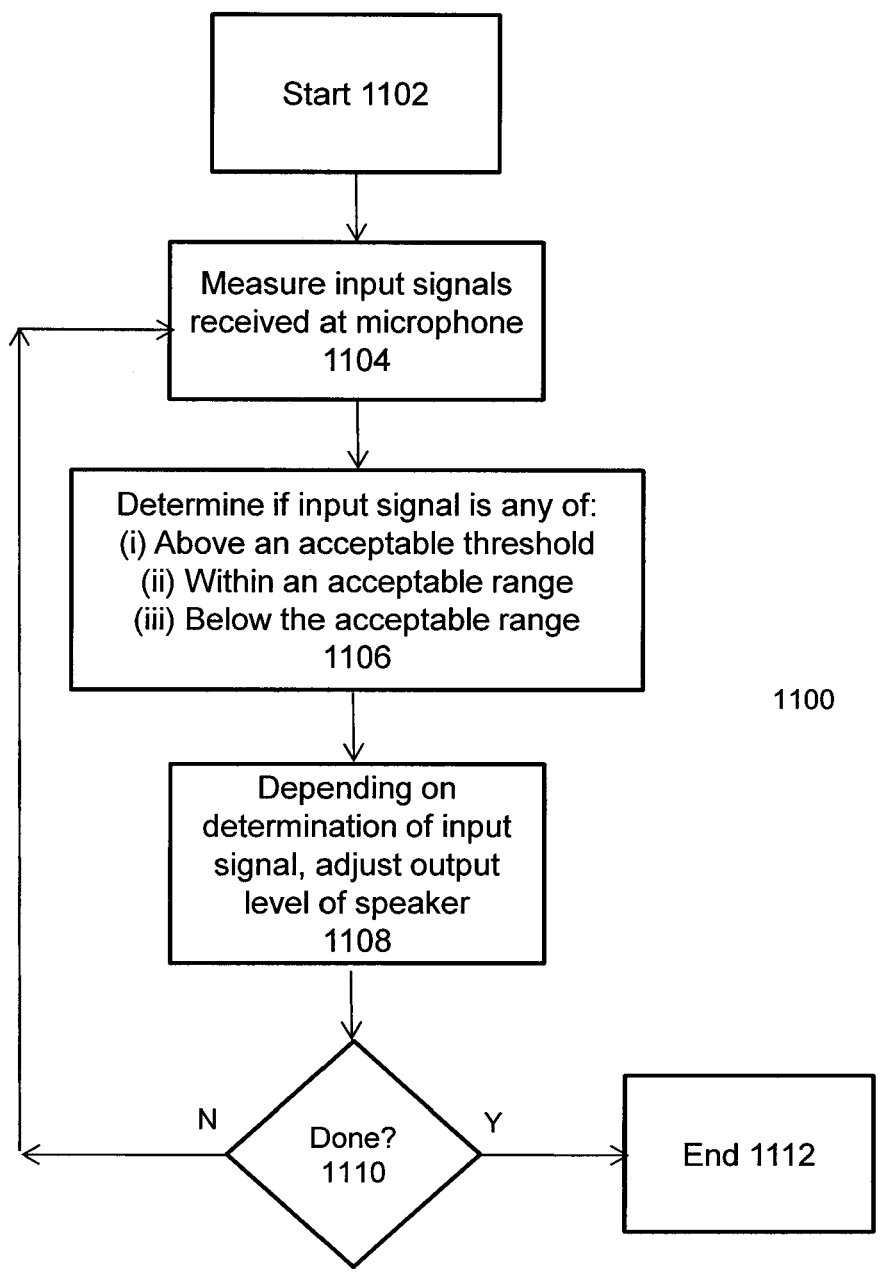
FIG. 11 is a flow chart of an exemplary process that adjusts the output of a speaker for the electronic device of FIG. 8A according to an embodiment.

Referring to FIG. 11, flow chart 1100 shows processes that may be executed by one or more of sound level application 54G and/or DSP 64 in measuring an output level of sound from speaker 16 notionally determined to be detected at a user's ear and in determining whether any adjustments are to be made to one or more characteristics of the output signal provided to speaker 16.

After start process 1102, flow chart 1100 moves to process 1104, where device 10 measures sound pressure levels emanated from speaker 16 that are detected by microphone 18.

Next, flow chart 1100 proceeds to process 1106, where device 10 processes the input signals and analyzes them so that the signals can be compared against one or more thresholds (e.g. upper and lower thresholds) and one or more expected operating range(s). In particular, microphone 18 generates voltage signals that can be processed (either in analog or digital form) so that data relating to the voltage signals can be compared against the threshold(s). Exemplary threshold and range tests are described below.

For one threshold test, in one embodiment signals generated by microphone 18 are used to detect when the output of speaker 16 exceeds a threshold of sound pressure level that is considered to be a "safe" or "acceptable" level. For example for cellular communication devices, safety standards have set a maximum sound pressure level at a user's ear to be 125 dBA. Exemplary standards include CAN/CSA-C22.2 No. 60950-1-03 and UL 60950-1, where for long duration disturbances a maximum steady-state A-weighted sound pressure coming from the earpiece or receiver is set to not exceed 125 dBA for handsets, 118 dBA for headsets and 121 dBA for insert earphones. On this basis, one embodiment uses a maximum threshold of approximately 118 dBA as a safety threshold. As such, a detected sound pressure that is above that threshold is deemed to be an unacceptable condition. The detected sound pressure may be a cumulative value or a peak value. In that case, the output of speaker 16 is adjusted so that the sound pressure produced by speaker 16 is decreased. The reduction can be achieved by reducing the value of the output signal provided to drive speaker 16. Certain frequencies in the output signal can be reduced based on a threshold of the total energy in the sound produced in a certain frequency range. Alternatively, a reduction can be implemented across all frequencies.

For one "acceptable range" test, when the signal generated by microphone 18 falls below the maximum acceptable threshold and above a minimum threshold, then that detected sound pressure level is considered to be within a "typical" or "normal" level. As such, in this situation, there are no safety issues with continuing to provide the current output signals to speaker 16. However, signals provided to speaker 16 may optionally be adjusted to provide adjustment (s) to the output of speaker 16, while still providing "safe" levels of sound pressure. The adjustments may be made to enhance the sound quality or the listening levels. For example, the spectrum of the output signal may be adjusted, where signals in some frequency range(s) are boosted and/or signals in other frequency range(s) are attenuated.

For a second threshold test, signals generated by microphone 18 are used to detect when the output of speaker 16 is too low, i.e. is below a minimum threshold of sound pressure level that is considered to be audibly "detectable" by the user. As such, a detected sound pressure that is below that minimum threshold indicates that characteristics of the output signal provided to speaker 16 may be boosted to generate sound pressure levels that are above the minimum threshold (but that preferably are still below the maximum safety threshold).

From process 1106, flow chart 1100 moves to process 1108, where depending on the results of the determination(s) made in process 1106, adjustment(s) are made to the output signal provided to speaker 16. Adjustments may be made to the output signals in the time domain and/or in the frequency domain. Generation of specific values for speaker 16 may be calculated by processor 36 and/or DSP 64. In an analog circuit configuration, a series of different analog filter circuits or boost circuits may be provided (e.g. a one or more low pass filters, high pass filters, notch filters, low frequency boost circuit, etc.) where depending on the value of the microphone signal, the output signal to speaker 16 is selectively routed first through a selectable filter and the output of the filter is provided to speaker 16. In a digital domain, current output values for speaker 16 and new adjustment values may be calculated or provided in a look-up table, stored in memory in device 10.

After the adjustment(s) are made to the output signal in process 1108, flowchart 1100 moves to process 1110, where a decision process is provided. The decision is whether another cycle of adjustments is to be made. The next measurements and evaluations may be done after a brief delay (e.g. after 20 ms or so), which may be tracked by a timer or may be provided through an interrupt routine to processor 36/DSP 64. If the timer expires and a further test is to be conducted, then flowchart 1100 moves back to process 1104. If a stop condition is encountered, however, flowchart 1100 moves from process 1110 to stop process 1112. Additional stop condition(s) may be incorporated as part of any process 1104-1108 and upon satisfaction of the stop condition(s), flowchart 1100 would end. It will be appreciated that processes 1102-1112 may be executed in different orders and at different times than provided in flow chart 1100. It will be seen that the process may receive and react to external triggers and signal from device 10 to re-start the process (e.g. user intervention from a volume change or an audio program change).

An embodiment may implement part or all of functions described in flow chart 1100 in different orders or through different mechanisms (e.g. such as through a state machine). A process implementing flow chart 1100 may be operating in the background of device 10. The process may be implemented in an application program interface (API) that allows software and applications operating on device 10 to access the functionality of the API through a program call. As such, in an API, several calls may be received from several different applications operating on device 10.

It will be appreciated that sound level application 54G and other applications in the embodiments may be implemented using known programming techniques, languages, processes and algorithms. Although the modules, processes and applications described are implemented in device 10, it will be appreciated that some functions of the modules may be provided in a separate server that is in communication with device 10. The titles of the applications are provided as a convenience to provide labels and assign functions to certain applications. It is not required that each module perform only its functions as described above. As such, specific functionalities for each application may be moved between applications or separated into different applications. Applications and modules may be contained within other applications. Different signalling techniques may be used to communicate information between applications using known programming techniques. Known data storage, access and update algorithms allow data to be shared between applications. It will further be appreciated that other applications and systems on device 10 may be executing concurrently with other applications. As such, any of application 54 (or parts thereof) may be structured to operate in as a "background" application on device 10, using programming techniques known in the art.

It will be appreciated that the embodiments relating to devices and systems may be implemented in a combination of electronic applications, modules, hardware, firmware and software. The firmware and software may be implemented as a series of processes, applications and/or modules that provide the functionalities described herein. The applications, algorithms and processes described herein may be executed in different order(s). Interrupt routines may be used. Data, applications, processes, programs, software and instructions may be stored in volatile and non-volatile devices described and may be provided on other tangible medium, like USB drives, computer discs, CDs, DVDs or other substrates herein and may be updated by the modules, applications, hardware, firmware and/or software. The data, applications, processes, programs, software and instructions may be sent from one device to another via a data transmission.

As used herein, the wording "and/or" is intended to represent an inclusive-or. That is, "X and/or Y" is intended to mean X or Y or both.

In this disclosure, all adjustment values, decrease values, cut-off values, thresholds and measured value are provided as an approximate value (for example, when the adjustment values is qualified with the word "about"), a range of values will be understood to be valid for that value. For example, for an adjustment value stated as an approximate value, a range of about 25% larger and 25% smaller than the stated value may be used. Thresholds, values, measurements and dimensions of features are illustrative of embodiments and are not limiting unless noted. Further, as an example, a "sufficient" match with a given condition or threshold may be a value that is within the provided threshold, having regard to the approximate value applicable to the threshold and the understood range of values (over and under) that may be applied for that threshold.

The present disclosure is defined by the claims appended hereto, with the foregoing description being merely illustrative of embodiments of the disclosure. Those of ordinary skill may envisage certain modifications to the foregoing embodiments which, although not explicitly discussed herein, do not depart from the scope of the disclosure, as defined by the appended claims.

The invention claimed is:

1. A feedback system for output sounds generated by a communication device, comprising:
    a speaker;
    a microphone;
    an enclosure for the communication device defining a first location for the placement of the speaker, a second location for the placement of the microphone, a first port connecting the first location to a cavity located on a top side of the enclosure, a second port connecting the second location to the cavity,
    the cavity comprising: a bottom; sidewalls inwardly extending from an external face of the enclosure to the bottom; and an access extending across the external face, and between the sidewalls, the cavity having a same cross-sectional shape from the access to the bottom, the first port extending from the bottom of the cavity to the speaker, the second port extending from the bottom of the cavity to the microphone, and respective openings of each of the first port and the second port adjacent to each other in the bottom of the cavity; and,
    a processor; and a memory device; the processor configured to:
        measure input signals detected by the microphone; and
        when the input signals are determined to be greater than a threshold, decrease a current output signal.

2. The feedback system as claimed in claim 1, wherein:
    the first port is shaped and has dimensions to be smaller than a cross section of an opening to an ear canal for a human.

3. The feedback system as claimed in claim wherein the first port has:
    a height of between approximately 1 mm and 4 mm; and
    a width of between approximately 2 mm and 15 mm.

4. The feedback system as claimed in claim 1 wherein:
    the threshold is approximately 125 dBA.

5. The feedback system as claimed in claim 4, wherein the the processor is further configured to:

when the input signals are determined to be less than the threshold, continue to provide the current output signal to the speaker.

6. The feedback system as claimed in claim 1, wherein the processor further configured to:
when the input signals are determined to be less than the threshold and greater than a minimum threshold, either:
continue to provide the current output signal provided to the speaker; or
change a characteristic of the current output signal to boost at least a portion of the current output signal, when the input signals at the microphone are still below the threshold.

7. The feedback system as claimed in claim 1, wherein the processor is further configured to:
when the input signals are determined to be less than a minimum threshold, increase the current output signal provided to the speaker, where the input signals at the microphone are still below the threshold.

8. The feedback system as claimed in claim 1, further comprising:
an alignment feature protruding from either the enclosure or a cover for the enclosure, the alignment feature located near the cavity and providing a physically detectable feature indicating when the device is being positioned about a user's ear.

9. A method of adjusting output sounds generated by a communication device, comprising:
measuring input signals detected by a microphone located in an enclosure for the communication device defining a first location for the placement of a speaker, a second location for the placement of the microphone adjacent to the speaker, a first port connecting the first location to a cavity located on a top side of the enclosure, and a second port connecting the second location to the cavity, the cavity comprising: a bottom; sidewalls inwardly extending from an external face of the enclosure to the bottom; and an access extending across the external face, and between the sidewalls, the cavity having a same cross-sectional shape from the access to the bottom, the first port extending from the bottom of the cavity to the speaker, the second port extending from the bottom of the cavity to the microphone, and respective openings of each of the first port and the second port adjacent to each other in the bottom of the cavity;
and
when the input signals are greater than a threshold, decreasing a current signal output.

10. The method of adjusting output sounds generated by a communication device, as claimed in claim 9, wherein:
the threshold is approximately 125 dBA.

11. The method of adjusting output sounds generated by a communication device, as claimed in claim 9, further comprising:
determining whether the input signals are less than the threshold and if so continuing to provide the current output signal to the speaker.

12. The method of adjusting output sounds generated by a communication device, as claimed in claim 9, further comprising:
determining whether the input signals are less than the threshold and greater than a minimum threshold, and if so, either
continuing to provide the current output signal to the speaker; or
changing a characteristic of the current output signal to boost at least a portion of the current output signal provided to the speaker, where the input signals at the microphone are still below the threshold.

13. The method of adjusting output sounds generated by a communication device, as claimed in claim 9, further comprising:
determining whether the input signals are less than a minimum threshold, and if so increasing the current output signal provided to the speaker, where the input signals at the microphone are still below the threshold.

14. The method of adjusting output sounds generated by a communication device, as claimed in claim 9, wherein:
the first port is shaped and has dimensions to be smaller than a cross section of an opening to an ear canal for a human.

15. The method of adjusting output sounds generated by a communication device, as claimed in claim 9, wherein the first port has:
a height of between approximately 1 mm and 4 mm; and
a width of between approximately 2 mm and 15 mm.

16. A non-transitory computer-readable medium storing a computer program, wherein execution of the computer program is for adjusting output sounds generated by a communication device:
measuring input signals detected by a microphone located in an enclosure for the communication device defining a first location for the placement of a speaker, a second location for the placement of the microphone adjacent to the speaker, a first port connecting the first location to a cavity located on a top side of the enclosure, and a second port connecting the second location to the cavity, the cavity comprising: a bottom; sidewalls inwardly extending from an external face of the enclosure to the bottom; and an access extending across the external face, and between the sidewalls, the cavity having a same cross-sectional shape from the access to the bottom, the first port extending from the bottom of the cavity to the speaker, the second port extending from the bottom of the cavity to the microphone, and respective openings of each of the first port and the second port adjacent to each other in the bottom of the cavity;
and
when the input signals are greater than a threshold, decreasing a current signal output.

* * * * *